ent Number: 4,871,422
Date of Patent: Oct. 3, 1989

United States Patent [19]
Scardera et al.

[54] ETCHING SOLUTIONS CONTAINING AMMONIUM FLUORIDE AND ANIONIC SULFATE ESTERS OF ALKYLPHENOL POLYGLYCIDOL ETHERS AND METHOD OF ETCHING

[75] Inventors: Michael Scardera, Hamden; Thomas S. Roche, Cheshire, both of Conn.

[73] Assignee: Olin Corporation, Cheshire, Conn.

[21] Appl. No.: 194,621

[22] Filed: May 16, 1988

Related U.S. Application Data

[63] Continuation-in-part of Ser. No. 7,067, Jan. 27, 1987, Pat. No. 4,761,245.

[51] Int. Cl.$^4$ ............................................. C09K 13/08
[52] U.S. Cl. ................................... 156/662; 156/657; 252/79.3
[58] Field of Search ......................... 252/79.3, 79.4; 156/657, 662

[56] References Cited

U.S. PATENT DOCUMENTS 3,181,984  5/1969  Tillis .................... 252/79.3
3,992,235  11/1976  Garbarini .............. 252/79.3
4,761,245  8/1988  Scardera et al. .

FOREIGN PATENT DOCUMENTS 0115583  8/1984  European Pat. Off. ........... 252/79.3
0773063  10/1980  U.S.S.R. .............................. 252/79.3

OTHER PUBLICATIONS

Fluorad, Fluorochemical Surfactants, a Product Information Bulletin by 3M, 1982.

*Primary Examiner*—David L. Lacey
*Assistant Examiner*—L. Johnson
*Attorney, Agent, or Firm*—James B. Haglind

[57] ABSTRACT

Etching solutions used to etch, for example, silicon dioxide coated substrates in the manufacture of integrated circuits comprise an aqueous solution of ammonium fluoride and a wetting amount of an anionic sulfate ester of alkylphenol polyglycidol ether. Preferred embodiments of the anionic sulfate esters of alkylphenol polyglycidol ethers may be represented by the formula:

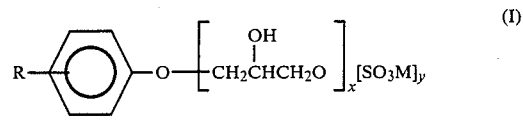

wherein R represents an alkyl group having from about 4 to about 12 carbon atoms, x is from about 3 to about 15, M represents H, an alkali metal, an alkaline earth metal, ammonium, or an amine, and y is from 0.2 to about 4. The etching solutions preferably contain hydrogen fluoride in a volume ratio of $NH_4F$ to HF to from about 3:1 to about 50:1. The novel etching solutions of the present invention have excellent wetting characteristics and retain their wetting properties after extended periods of continuous filtration through submicron filters.

29 Claims, No Drawings

ETCHING SOLUTIONS CONTAINING AMMONIUM FLUORIDE AND ANIONIC SULFATE ESTERS OF ALKYLPHENOL POLYGLYCIDOL ETHERS AND METHOD OF ETCHING

This application is Continuation-in-Part of U.S. Ser. No. 007,067, now U.S. Pat. No. 4,761,245 filed Jan. 27, 1987.

This invention relates to etching solutions used in the manufacture of integrated circuits. More particularly this invention relates to etching solutions containing wetting agents to properly wet substrates of components in the manufacture of integrated circuits.

As integrated circuit component dimensions decrease, physical wetting by etchant solutions on substrate surfaces becomes more difficult. This is especially important for buffered oxide etchants i.e., ammonium fluoride/hydrofluoric acid solutions used in silicon dioxide etching as these solutions exhibit extremely high surface tension values at typical etching temperatures. Because of the relatively low surface energies of the masking materials used and the photoresist topography, it is difficult to properly wet the substrate, which results in non-uniform etching and poor line reproduction.

While pretreatment ("predipping") of the component into a surfactant solution before placing the substrates in the etching solution is known, more satisfactory results are obtained by the addition of the wetting agent to the etching solution. However, most surfactants commonly used in the industry are insoluble in buffered oxide etchant solutions containing ammonium fluoride and hydrofluoric acid. Further, sufficient amounts of the wetting agent must remain in the etching solution after filtration through filters on the order of 0.2 microns to provide the desired wetting of the substrates during the etching process.

Wetting agents containing fluorochemical compounds have been employed as additives to NH$_4$F/HF etching solutions to improve wetting properties. Examples of fluorochemical compounds include perfluorinated alkyl sulfonates described in U.S. Pat. No. 4,517,106, issued May 14, 1985, and fluorinated cycloalkane and cycloalkene sulfonates taught in U.S. Pat. No. 4,620,934, issued Nov. 4, 1986 to R. J. Hopkins et al; fluorine-containing carboxylic acids described in U.S. Pat. No. 4,582,624, issued Apr. 15 1986 to N. Enjo et al; and fluorine-containing diamine compounds as described in Japanese Patent Kokai Publication No. 53,980/1983 published Mar. 30, 1983 by Daikin Kogyo KK. Some of these wetting agents are readily removed during filtration through sub-micron filters; others have low solubility in the etching solutions; and in addition, these wetting agents are expensive to use.

There is a need for wetting agents which are readily soluble in buffered etching solutions containing ammonium fluoride, which retain their solubility and wetting characteristics after repeated filtrations through sub-micron filters and in addition, provide excellent wetting properties at reduced costs.

It is an object of the present invention to provide etching solutions for use in integrated circuit manufacture having excellent wetting characteristics which are retained during filtration through sub-micron filters.

Another object of the present invention is to provide buffered etching solutions containing ammonium fluoride and hydrogen fluoride having excellent wetting characteristics for components having small and large geometries.

A further object of the present invention is to provide a process for etching silicon dioxide substrates having desirable etching rates.

These and additional objects of the present invention are accomplished in an etching solution comprising an aqueous solution of ammonium fluoride and a wetting amount of an anionic sulfate ester of an alkylphenol polyglycidol ether.

In more detail, the anionic sulfate esters of alkylphenol polyglycidol ethers which are useful as wetting agents in the etching solutions of the present invention include those having an alkyl substituted phenol adduct with any suitable number of glycidol groups and at least about 0.1 moles of sulfate ester or a water-soluble sulfate salt.

Suitable anionic sulfate esters of alkylphenol polyglycidol ethers may be represented by the formula:

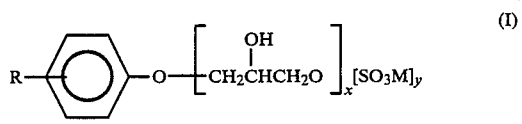

wherein R represents an alkyl group having from about 4 to about 12 carbon atoms, x is from about 3 to about 15, M represents H, an alkali metal, an alkaline earth metal, ammonium, or an amine, and y is from 0.2 to about 4.

The alkylphenol polyglycidol ether sulfate esters which are useful as wetting agents in the etching solutions of this invention having the above formula include those in which R represents alkyl groups including, for example, butyl, hexyl, octyl, nonyl, and dodecyl. Preferred embodiments include those in which R represents an alkyl group having from about 8 to about 12 carbon atoms and these include octyl, nonyl, and dodecyl groups. The polyglycidol ether groups represented by x are preferably in the range of from about 6 to about 12. It should be noted that x represents an average number of glycidol units per alkylphenol unit. The sulfate group may be in the free acid ester form in which case M represents H, or a water-soluble salt thereof where M represents an alkali metal, an alkaline earth metal, ammonium, or an amine. Suitable salts include those in which M represents sodium or potassium, ammonium, calcium or magnesium or an amine such as ethanolamine, diethanolamine, triethanolamine, methylamine, dimethylamine, trimethylamine, ethylamine, triethylamine, diethylamine, butylamine, propylamine, cyclohexylamine, morpholine, pyridine, octanolamine, octylamine, and the like.

Preferred embodiments of the wetting agent used in the etching compositions of the present invention are those in which R represents an alkyl group having from about 8 to about 12 carbon atoms; M represents an alkali metal such as Na or K, ammonium (NH$_4$) or an amine; and y is from about 1 to about 3.

More preferred embodiments for etching compositions to be used in etching small geometries are those free of mobile ions and M is ammonium, and R represents an alkyl group located primarily in the para position. These wetting agents do not incorporate metallic ions which may be present during the etching process.

Anionic alkylphenol polyglycidol ether sulfate esters of the above type can be produced using processes such as those described in U.S. Pat. Nos. 2,213,477 and 2,233,281 to produce the alkylphenol polyglycidol ethers followed by the esterification method, for example, described in U.S. Pat. Nos. 2,758,977 or 3,725,080.

These liquid anionic wetting agent are employed in any suitable wetting amounts which, in the buffered oxide etching solutions, will enhance the wetting of the substrate to be etched. Suitable amounts include those in the range of from about 5 to about 50,000 parts per million by weight, preferably from about 25 to about 30,000, and more preferably from about 50 to about 5,000 parts per million.

The novel etching solutions of the present invention all retain their wetting properties after 0.2 micron filtration, even under continuous filtration conditions. Moreover, the etching solutions after filtering have the property of wetting substrates more effectively and yield more uniform results by etching small geometries (1 to 5 microns) and large geometries (>5 micron) of silicon dioxide in a patterned resist at the same rate without additional deleterious effects.

The novel etching solutions of the present invention, as buffered oxide etchants, are aqueous solutions of ammonium fluoride having a concentration of between about 15 percent and about 40 percent by weight of $NH_4F$. Admixed with the ammonium fluoride is an aqueous solution of hydrogen fluoride in amounts which provide the buffered oxide etchant with at least about 3 parts by volume of $NH_4F$ to about 1 part by volume of HF and up to about 100 parts by volume of $NH_4F$ to about 1 part by volume of HF. In preparing the buffered oxide etching solutions of the present invention, commercially available concentrated aqueous solutions of $NH_4F$ (normally about 40 percent by weight) and HF (normally about 49 percent by weight) may be employed.

Other acids could be used in place of hydrogen fluoride in the ammonium fluoride etching solutions of the present invention including, for example, hydrogen chloride, acetic acid, nitric acid, fluoroboric acid, and the like.

The novel etching solution of the present invention may be prepared in any suitable manner. For example, an aqueous solution of ammonium fluoride and the wetting agent may be prepared and the hydrogen fluoride then added; the aqueous solutions of ammonium fluoride and hydrogen fluoride and the liquid anionic wetting agent may be simultaneously blended or the aqueous mixture of ammonium fluoride and hydrogen fluoride prepared and the liquid wetting agent then blended in.

Other additives normally used in buffered oxide etchant solutions may be included in the novel etching solutions of the present invention. For example, polar solvent diluents such as acetic acid, ethylene glycols, glycerol, and lower alkyl alcohols having from 1 to about 4 carbon atoms may be included.

The etching solutions are used to etch silicon dioxide coated substrates in the manufacture of integrated circuits employing methods and procedures known in the semiconductor industry.

The novel etching solutions of the present invention provide etchant solutions with reduced surface tensions after microfiltration which improves substrate wetting and yields superior etchant performance resulting in cleaner surfaces and greater uniformity of etched profiles without incorporating foreign metallic ions. The solutions are stable and have desirable shelf lives without phase separations of the wetting agent from the $NH_4F$ and HF components.

The following examples illustrate the present invention with no intention of being limited thereby

EXAMPLE 1

Preparation of the Sulfate Ester (1) of Nonylphenol Polyglycidol (10) Ether*

In a reactor fitted with a thermometer, a magnetic stirrer, and an $N_2$ gas inlet, was placed 130 g (.13 mole) nonylphenol polyglycidol (10) ether. The flask was heated to 123° C. and 13.0 g (.13 m) sulfamic acid was added. After an initial temperature drop, the temperature quickly rose, reaching a peak of 153° C., then fell back to 125° C. The product mixture was stirred and heated for an additional 40 minutes. After cooling to 55° C., 40 ml ethanol, 36 ml water, and 4 ml 30 percent $H_2O_2$ were added. The temperature was increased to 70° C. and heated an additional hour with stirring. An additional 6 ml water was then added, the reaction mixture cooled to ambient temperature, and the product collected. The product, a 1.0 m sulfate ester of nonylphenol polyglycidol (10) weighed 222 g and was obtained as a 65 percent active solution.

(*Olin Glycidol Surfactant 10G, a product of Olin Corporation.)

EXAMPLE 2

Preparation of Sulfate (1.5) Ester of Nonylphenol Polyglycidol (10) Ether

In a reactor of the type used in EXAMPLE 1 was placed 137 g (.14 mole) nonylphenol polyglycidol (10) ether. The flask was heated to 125° C. and 6.86 g sulfamic acid is added. After stirring and allowing the reaction temperature to return to 125° C. from the resulting exotherm, an additional 6.86 g of sulfamic acid was added. The procedure was repeated with an additional 6.86 g sulfamic acid so that a total of 20.6 g (.21 mole) sulfamic acid was reacted. The reaction mixture was stirred at 120° to 125° C. for two hours. The temperature was then reduced by cooling to 70° C. and 42 ml ethanol, 5 ml $H_2O_2$ and 43 ml water added. After stirring for an additional hour, the product was collected. The product, 1.5 m sulfate ester of nonylphenol polyglycidol (10) was obtained as a 65 percent active solution and weighed 240 g.

EXAMPLES 3-4

Using the procedure of EXAMPLE 1, the sulfate ester (1) of nonylphenol polyglycidol (6) ether and the sulfate ester (3) of nonylphenol polyglycidol (10) ether were prepared.

EXAMPLE 5

A buffered oxide etching aqueous solution was prepared containing 7 parts by volume of 40 percent ammonium fluoride and 1 part by volume of 49 percent hydrogen fluoride. To 800 mls of the etching solution was added 250 parts per million of the nonylphenol polyglycidol sulfate (1) ester containing about 10 glycidol units as prepared in EXAMPLE 1 as the wetting agent. The surface tension of the etching solution was measured with a Du Nouy Ring Tensiometer at 25° C. The solution was continuously filtered through a 0.2 micron polytetrafluoroethylene filter (Millipore) at a rate of 800 ml/min for 5 to 5-½ hours and the surface tension measured again. The results are shown in TABLE I below.

EXAMPLES 6-8

The precedure described in EXAMPLE 5 was followed exactly using the wetting agents prepared in EXAMPLES 2, 3, and 4 respectively. The results are shown in TABLE I below.

TABLE I

| Example No. | Wetting Agent | Surface Tension (dynes/cm) Before Filtration | After Filtration |
|---|---|---|---|
| 5 | Nonylphenol polyglycidol (10) sulfate (1) ester | 32.4 | 35.9 |
| 6 | Nonylphenol polyglycidol (10) sulfate (1.5) ester | 34.0 | 34.0 |
| 7 | Nonylphenol polyglycidol (6) sulfate (1) ester | 30.0 | 32.7 |
| 8 | Nonylphenol polyglycidol (10) sulfate (3) ester | 35.3 | 38.7 |

EXAMPLES 5-8 show that the loss in wetting activity after continuous filtration over an extended period of time is negligible.

EXAMPLES 9-12

Four inch silicon wafers were oxidized thermally to about 6000 A (determinate by ellipsometry) coated with positive photoresist to a thickness of about 1.2 microns, and patterned with masks having geometries of about 1.6 to about 2 microns. The etch time was then calculated. One wafer was immersed in the buffered oxidized etching solution of EXAMPLE 5. The etching, at 25° C., was conducted until the 100 percent etch time, as calculated, was attained. The etched pattern was then rinsed in water. The wafer was then inspected with a light microscope with a magnification in the range of 400X to 1000X. This procedure was repeated with the buffered oxide etching solutions of EXAMPLES 6, 7, and 8.

Comparative Examples A, B, and C

The procedure of EXAMPLES 9-12 was repeated exactly with three 4-inch silicon wafers. The patterned wafers were immersed in a buffered oxide etching solution (volume ratio 7:1 of NH$_4$F:HF) which contained no wetting agent for etch times of 100 percent, 105 percent, and 110 percent. The etched wafers were then rinsed in water and inspected using the procedure of EXAMPLES 9-12. The results are given in TABLE II below.

TABLE II

| Example No. | % of Etch Time | 2 Micron | 1.8 Micron | 1.6 Micron |
|---|---|---|---|---|
| 9 | 100 | 100 | 100 | 100 |
| 10 | 100 | 100 | 100 | 100 |
| 11 | 100 | 100 | 100 | 100 |
| 12 | 100 | 100 | 100 | 100 |
| Comparative A | 100 | 63 | 51 | 42 |
| Comparative B | 105 | 98 | 95 | 89 |
| Comparative C | 110 | 100 | 100 | 98 |

The results in TABLE II illustrate that the etching solutions of the present invention (EXAMPLES 9-12) etch small geometries completely with the desired etch time without requiring overetching which results in the loss of pattern definition.

What is claimed is:

1. An etching solution comprising an aqueous solution of ammonium fluoride and a wetting amount of an anionic sulfate ester of an alkylphenol polyglycidol ether.

2. The etching solution of claim 1 containing at least 0.1 moles of sulfate ester or a water soluble sulfate salt.

3. The etching solution of claim 1 in which the ammonium fluoride is present in concentrations of from about 15 to about 40 percent by weight.

4. The etching solution of claim 1 in which the wetting amount of anionic alkylphenol polyglycidol ether sulfate is from about 5 to about 50,000 parts per million by weight.

5. The etching solution of claim 1 in which hydrogen fluoride is present and the volume ratio of NH$_4$F to HF is from about 3:1 to about 100:1.

6. The etching solution of claim 1 in which the anionic sulfate ester of an alkylphenyl polyglycidol ether is represented by the formula:

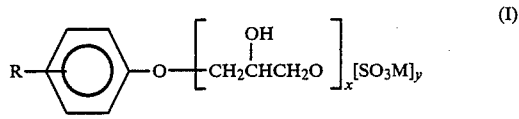

wherein R represents an alkyl group having from about 4 to about 12 carbon atoms, x is from about 3 to about 15, M represents H, an alkali metal, an alkaline earth metal, ammonium, or an amine, and y is from 0.2 to about 4.

7. The etching solution of claim 6 in which M represents an alkali metal, ammonium, or an amine.

8. The etching solution of claim 6 in which R represents an alkyl group having from about 8 to about 12 carbon atoms.

9. The etching solution of claim 8 in which x is from about 6 to about 12.

10. The etching solution of claim 9 in which y is from 1 to about 3.

11. The etching solution of claim 10 in which M represents ammonium.

12. The etching solution of claim 11 in which the ammonium fluoride is present in concentrations of from about 15 to about 40 percent by weight.

13. The etching solution of claim 12 in which hydrogen fluoride is present and the volume ratio of NH$_4$F to HF is from about 3:1 to about 100:1.

14. The etching solution of claim 13 in which the wetting amount is from about 25 to about 30,000 parts per million by weight.

15. The etching solution of claim 13 in which R represents an alkyl group which is primarily in the para position.

16. The etching solution of claim 15 in which R represents the nonyl group.

17. The etching solution of claim 16 in which x is from about 6 to about 12.

18. A process for etching a silicon dioxide coated substrate which comprises immersing the substrate in a aqueous etching solution comprised of ammonium fluoride and a wetting amount of an anionic sulfate ester of an alkylphenol polyglycidol ether.

19. The process of claim 18 in which the ammonium fluoride is present in concentrations of from about 15 to about 40 percent by weight.

20. The process of claim 19 in which hydrogen fluoride is present and the volume ratio of NH$_4$F to HF is from about 3:1 to about 50:1.

21. The process of claim 18 in which the wetting amount of anionic sulfate ester of an alkylphenol polyglycidol ether sulfate is from about 5 to about 50,000 parts per million by weight.

22. The process of claim 18 in which the anionic sulfate ester of an alkylphenyl polyglycidol ether is represented by the formula:

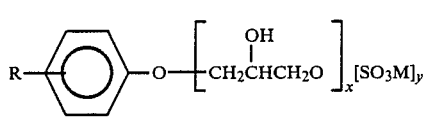
(I)

wherein R represents an alkyl group having from about 4 to about 12 carbon atoms, x is from about 3 to about 15, M represents H, an alkali metal, an alkaline earth metal, ammonium, or an amine, and y is from 0.2 to about 4.

23. The process of claim 22 in which M represents ammonium or an amine and x is from about 6 to about 12.

24. The process of claim 23 in which R represents an alkyl group having from about 8 to about 12 carbon atoms.

25. The process of claim 24 in which y is from about 1 to about 3.

26. The etching solution of claim 25 in which the ammonium fluoride is present in concentrations of from about 15 to about 40 percent by weight.

27. The etching solution of claim 26 in which hydrogen fluoride is present and the volume ratio of NH$_4$F to HF is from about 3:1 to about 100:1.

28. The process of claim 27 in which R represents the nonyl group and x is from about 6 to about 12.

29. The process of claim 28 in which the wetting amount is from about 25 to about 30,000 parts per million by weight.

* * * * *